United States Patent
Kamiguchi et al.

(10) Patent No.: US 8,669,832 B2
(45) Date of Patent: Mar. 11, 2014

(54) ACOUSTIC WAVE DEVICE AND ACOUSTIC WAVE FILTER

(75) Inventors: Hiroki Kamiguchi, Osaka (JP);
Hidekazu Nakanishi, Osaka (JP);
Yosuke Hamaoka, Osaka (JP); Shoji Okamoto, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 397 days.

(21) Appl. No.: 13/125,633

(22) PCT Filed: Feb. 23, 2010

(86) PCT No.: PCT/JP2010/001170
§ 371 (c)(1),
(2), (4) Date: Apr. 22, 2011

(87) PCT Pub. No.: WO2010/098065
PCT Pub. Date: Sep. 2, 2010

(65) Prior Publication Data
US 2011/0193655 A1 Aug. 11, 2011

(30) Foreign Application Priority Data
Feb. 25, 2009 (JP) .................... 2009-041944
May 22, 2009 (JP) .................... 2009-123758

(51) Int. Cl.
*H03H 9/64* (2006.01)
*H03H 9/25* (2006.01)
*H03H 9/42* (2006.01)

(52) U.S. Cl.
USPC ......... 333/195; 333/193; 333/154; 310/313 B

(58) Field of Classification Search
USPC ................. 333/133, 150, 151, 154, 193–196; 310/313 B, 313 D
See application file for complete search history.

(56) References Cited

U.S. PATENT DOCUMENTS

| | | | |
|---|---|---|---|
| 6,246,148 B1 * | 6/2001 | Flowers et al. | 310/313 B |
| 6,335,584 B1 | 1/2002 | Kadota et al. | |
| 7,336,016 B2 * | 2/2008 | Oshio | 310/313 B |
| 7,372,347 B2 * | 5/2008 | Orito et al. | 333/193 |
| 7,965,155 B2 * | 6/2011 | Nakamura et al. | 333/133 |
| 2003/0155993 A1 | 8/2003 | Takamine et al. | |
| 2004/0233018 A1 | 11/2004 | Watanabe et al. | |
| 2005/0212621 A1 | 9/2005 | Takamine | |
| 2010/0219905 A1 * | 9/2010 | Nakamura et al. | 333/133 |

FOREIGN PATENT DOCUMENTS

| | | |
|---|---|---|
| CN | 1264220 | 8/2000 |
| JP | 63-266912 | * 11/1988 |

(Continued)

OTHER PUBLICATIONS

International Search Report of PCT Application No. PCT/JP2010/001170 dated May 25, 2010.

*Primary Examiner* — Barbara Summons
(74) *Attorney, Agent, or Firm* — Panasonic Patent Center

(57) ABSTRACT

An acoustic wave device includes an interdigital transducer (IDT) electrode and a separate electrode facing the IDT electrode. The IDT electrode includes first and second comb-shaped electrode facing each other. The first comb-shaped electrode includes a first bus bar, first interdigitated electrode fingers, and first dummy electrode fingers. The second comb-shaped electrode includes a second bus bar second interdigitated electrode fingers interdigitated with the first interdigitated electrode fingers, second dummy electrode fingers facing the first interdigitated electrode fingers, weighted parts, and a non-weighted part. The weighted parts have electrodes at spaces between the second interdigitated electrode fingers and the second dummy electrode fingers. In the non-weighted part, there is no electrode at a space out of the spaces which is closest to the separate electrode in the non-interdigitated region. This acoustic wave device prevents short circuits between the IDT electrode and the separate electrode, and provides excellent characteristics of suppressing unwanted waves.

18 Claims, 13 Drawing Sheets

(56) References Cited

FOREIGN PATENT DOCUMENTS

| JP | 9-107259 | 4/1997 |
| JP | 2003-218665 | 7/2003 |
| JP | 2003-309448 | 10/2003 |
| JP | 2004-343573 | 12/2004 |
| JP | 2005-159835 | 6/2005 |
| JP | 2006-186435 | * 7/2006 |
| JP | 2006-352764 | 12/2006 |
| JP | 2009-038718 | 2/2009 |
| WO | 2005/031971 | 4/2005 |

* cited by examiner

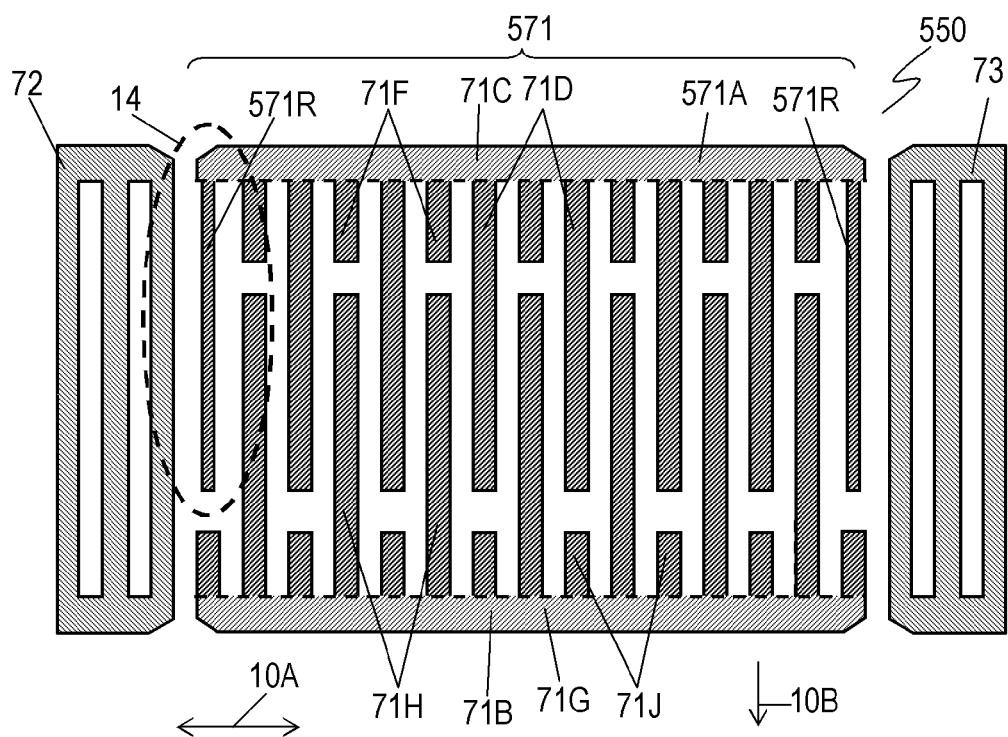
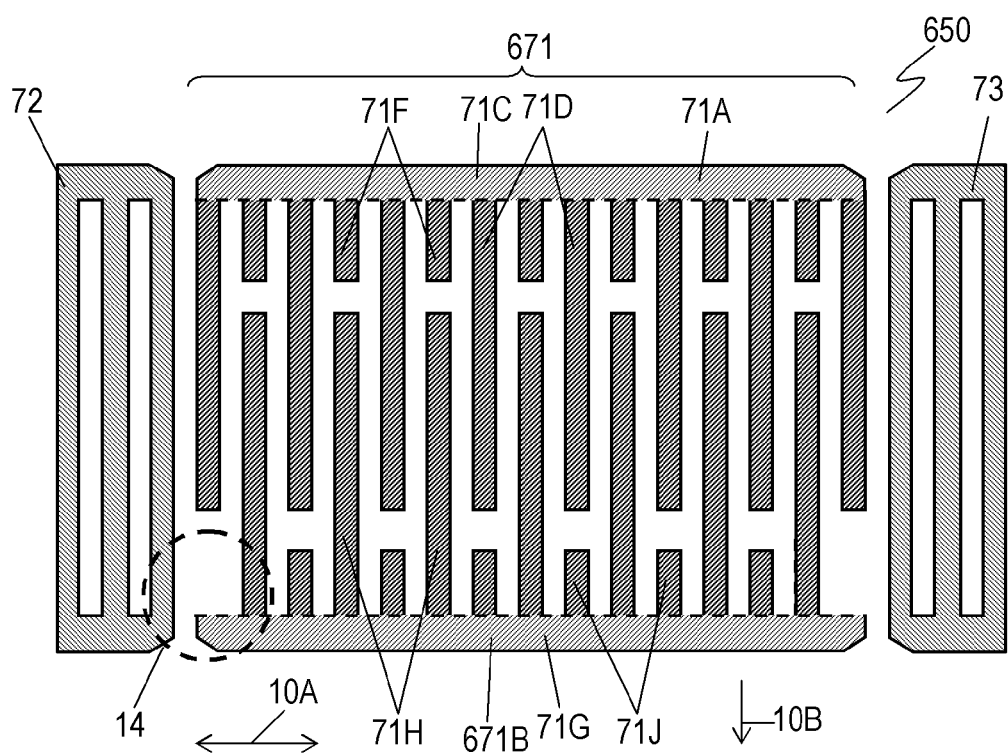

ACOUSTIC WAVE DEVICE AND ACOUSTIC WAVE FILTER

The present application is a U.S. national stage application of the PCT international application No. PCT/JP2010/001170 filed on Feb. 23, 2010, and claims the benefit of foreign priority to Japanese application No. 2009-041944 filed on Feb. 25, 2009 and application No. 2009-123758 filed on May 22, 2009.

TECHNICAL FIELD

The present invention relates to an acoustic wave device having electrodes facing each other, and an acoustic wave filter.

BACKGROUND ART

Acoustic wave devices are used in acoustic wave filters, such as high-frequency filters in communication devices, such as mobile phones. FIG. 8A is a plan view of conventional acoustic wave device 70A disclosed in Patent Literature 1. Acoustic wave device 70A is an acoustic wave resonator. Acoustic wave device 70A includes a piezoelectric substrate, interdigital transducer (IDT) electrode 71, and reflector electrodes 72 and 73. Electrodes 71, 72, and 73 are formed on the piezoelectric substrate. IDT electrode 71 includes comb-shaped electrodes 71A and 71B facing each other. Comb-shaped electrode 71A includes interdigitated electrode fingers 71D, and comb-shaped electrode 71B includes interdigitated electrode fingers 71H. Interdigitated electrode fingers 71D and 71H are interdigitated with each other. Reflector electrodes 72 and 73 are arranged at both sides in the propagation direction of an acoustic wave excited by IDT electrode 71.

Comb-shaped electrode 71A includes bus bar 71C, interdigitated electrode fingers 71D, and dummy electrode fingers 71F. Electrode fingers 71D and 71F are electrically connected to bus bar 71C. Dummy electrode fingers 71F face interdigitated electrode fingers 71H of comb-shaped electrode 71B. Comb-shaped electrode 71B includes bus bar 71G, interdigitated electrode fingers 71H, and dummy electrode fingers 71J. Electrode fingers 71H and 71J are electrically connected to bus bar 71G. Dummy electrode fingers 71J face interdigitated electrode fingers 71D of comb-shaped electrode 71A.

Dummy electrode fingers 71F and 71J disposed in non-interdigitated regions 75A and 75C confine transverse mode spurious responses, which are unwanted resonant components in these regions.

FIG. 8B is a plan view of another conventional acoustic wave device 70B disclosed in Patent Literature 1. Acoustic wave device 70B is an acoustic wave resonator. In FIG. 8B, components identical to those of acoustic wave device 70A shown in FIG. 8A are denoted by the same reference numerals. Comb-shaped electrode 71A includes weighted parts 71K, which are formed at spaces between each interdigitated electrode finger 71D and each dummy electrode finger 71F in non-interdigitated region 75A. Comb-shaped electrode 71B includes weighted parts 71M, which are formed at spaces between each interdigitated electrode finger 71H and each dummy electrode finger 71J in non-interdigitated region 75C.

Gradually changing the size of weighted parts 71K and 71M along bus bars 71C and 71G can effectively suppress the transverse mode spurious responses confined by dummy electrode fingers 71F and 71J.

In acoustic wave device 70A, short circuits may occur between IDT electrode 71 and reflector electrode 72 or 73, causing property degradation of acoustic wave device 70A. In acoustic wave device 70B, more short circuits may occur between IDT electrode 71 and reflector electrode 72 or 73.

The following is a description of acoustic wave device 70B in which frequent short circuits may occur.

FIGS. 9A to 9H are sectional views showing production processes of acoustic wave device 70B. In FIG. 9A, electrode film 82 is formed by a method, such as deposition or sputtering, on an upper surface of substrate 81 made of a piezoelectric material, such as $LiTaO_3$. In FIG. 9B, resist film 83 is formed on an upper surface of electrode film 82. In FIG. 9C, resist film 83 is processed into a desired shape by photolithography. In FIG. 9D, electrode film 82 is processed to have a desired shape to form IDT electrode 71, reflector electrodes 72 and 73, and other components by, for example, dry etching, and then resist film 83 is removed. In FIG. 9E, protective film 84, which is a thin film made of dielectric material, such as $SiO_2$, is formed by a method, such as deposition or sputtering, so as to coat electrode film 82. In FIG. 9F, resist film 85 is formed on the surface of protective film 84. In FIG. 9G, resist film 85 is processed to have a desired shape by, for example, exposure and development. In FIG. 9H, unnecessary portions of protective film 84, such as pad 86 for the input and output of electrical signals, is removed by, for example, dry etching, and then resist film 85 is removed. Finally, the laminated body is diced into individual chips, each of which is then mounted on a package by die bonding or other methods, and are wire bonded. A lid is fixed by welding or other methods so as to hermetically seal the package, thereby providing acoustic wave device 70B.

FIGS. 10A to 10C are sectional views showing the production processes of acoustic wave device 70B from the exposure of resist film 83 to its removal in more detail than in FIGS. 9B to 9D, respectively. FIG. 10C is a sectional view taken along a line 10C-10C shown in FIG. 8B.

In FIG. 10A, resist film 83 is exposed through mask 91 to exposure light emitted from a light source, and then developed. As a result, resist film 83 remains only in unexposed portions. Mask 91 includes mask portion 91B for forming IDT electrode 71, and mask portions 91A and 91C for forming reflector electrodes 72 and 73, respectively.

In FIG. 10B, resist film 83 shown in FIG. 10A becomes resist film 83A after the exposure and development. Resist film 83A includes resist films 92A, 92B, and 92C. In this case, unwanted resist films 93 may remain between resist film 92B which becomes IDT electrode 71 and each of resist films 92A and 92C which become reflector electrodes 72 and 73, respectively. Upon being dry-etched through resist film 83A including unwanted resist films 93, as shown in FIG. 10B, electrode film 82 cannot be etched in a desired shape because unwanted electrode films 94 remain as shown in FIG. 10C. As a result, short circuits may occur between IDT electrode 71 and reflector electrode 72 or 73, causing the property degradation of acoustic wave device 70B.

CITATION LIST

Patent Literature

Patent Literature 1: Japanese Patent Unexamined Publication No. 2006-352764

SUMMARY OF THE INVENTION

An acoustic wave device includes an interdigital transducer (IDT) electrode and a separate electrode facing the IDT electrode. The IDT electrode includes first and second comb-shaped electrode facing each other. The first comb-shaped electrode includes a first bus bar, first interdigitated electrode fingers, and first dummy electrode fingers. The second comb-shaped electrode includes a second bus bar second interdigitated electrode fingers interdigitated with the first interdigitated electrode fingers, second dummy electrode fingers facing the first interdigitated electrode fingers, weighted parts, and a non-weighted part. The weighted parts have electrodes at spaces between the second interdigitated electrode fingers and the second dummy electrode fingers. In the non-weighted part, there is no electrode at a space out of the spaces which is closest to the separate electrode in the non-interdigitated region.

This acoustic wave device prevents short circuits between the IDT electrode and the separate electrode, and provides excellent characteristics of suppressing unwanted waves.

BRIEF DESCRIPTION OF THE DRAWINGS

FIG. 6B is a plan view of a further acoustic wave filter according to the third exemplary embodiment.

FIG. 6C is a plan view of a further acoustic wave filter according to the third exemplary embodiment.

DETAILED DESCRIPTION OF PREFERRED EMBODIMENTS FIRST EXEMPLARY EMBODIMENT

Figure 1A:
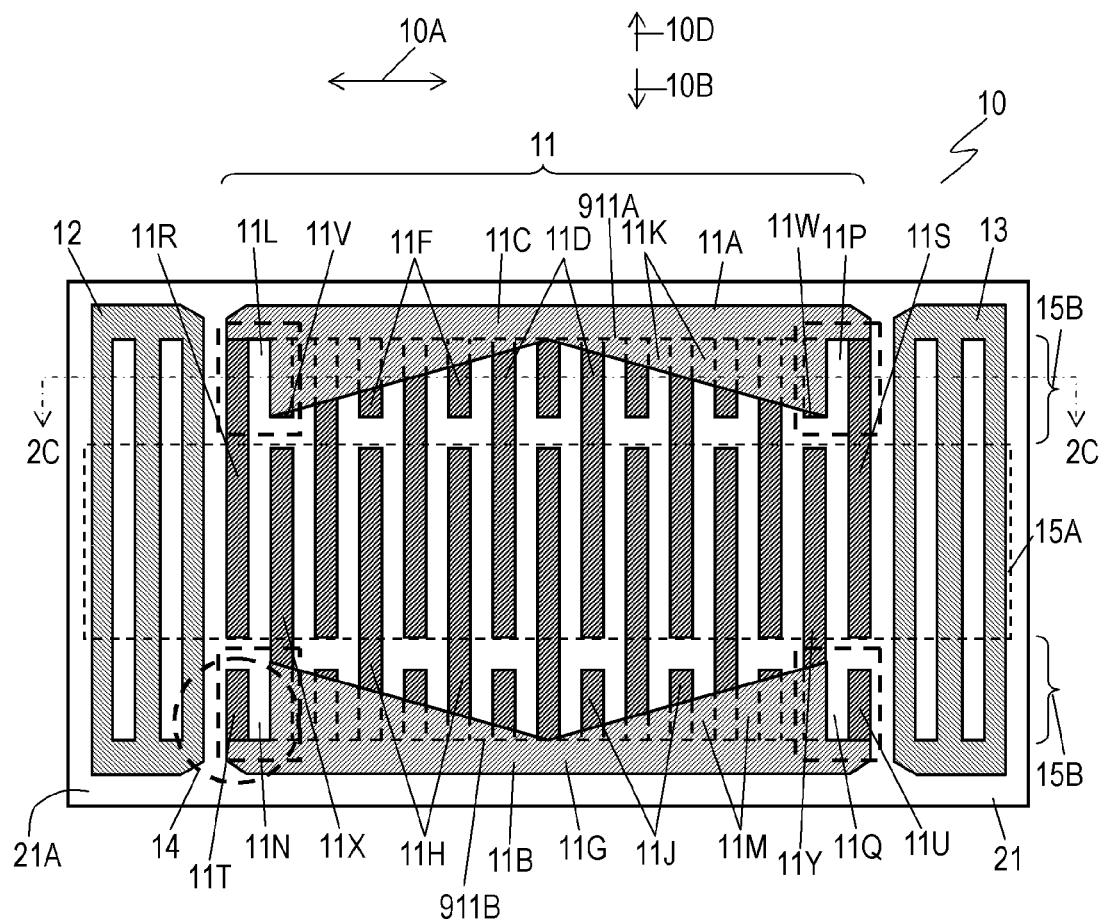
FIG. 1A is a plan view of an acoustic wave device according to a first exemplary embodiment of the present invention.

FIG. 1A is a plan view of acoustic wave device 10 according to a first exemplary embodiment of the present invention. Acoustic wave device 10 includes piezoelectric substrate 21, interdigital transducer (IDT) electrode 11, and reflector electrodes 12 and 13. Electrodes 11, 12, and 13 are formed on surface 21A of piezoelectric substrate 21, and made of a conductive material, such as aluminum, silver, gold, platinum, titanium, copper, or alloys thereof. Reflector electrodes 12 and 13 are separate electrodes different from IDT electrode 11. IDT electrode 11 includes comb-shaped electrodes 11A and 11B facing each other. IDT electrode 11 excites an acoustic wave which propagates in direction 10A along surface 21A. Reflector electrodes 12 and 13 are arranged at both sides of IDT electrode 11 in direction 10A. In other words, IDT electrode 11 is arranged between reflector electrodes 12 and 13 in direction 10A.

Comb-shaped electrode 11A made of the above-mentioned conductive material includes bus bar 11C, interdigitated electrode fingers 11D, and dummy electrode fingers 11F. Bus bar 11C extends in direction 10A. Interdigitated electrode fingers 11D extend from bus bar 11C toward comb-shaped electrode 11B in direction 10B which is different from or substantially perpendicular to direction 10A. Dummy electrode fingers 11F extend from bus bar 11C toward comb-shaped electrode 11B in direction 10B. Comb-shaped electrode 11B made of the above-mentioned conductive material includes bus bar 11G, interdigitated electrode fingers 11H, and dummy electrode fingers 11J. Bus bar 11G extends in direction 10A. Interdigitated electrode fingers 11H extend from bus bar 11G toward comb-shaped electrode 11A in direction 10D which is opposite to direction 10B. Dummy electrode fingers 11J extend from bus bar 11G toward comb-shaped electrode 11A in direction 10D. Interdigitated electrode fingers 11H are interdigitated with interdigitated electrode fingers 11D of comb-shaped electrode 11A in interdigitated region 15A. In other words, interdigitated electrode fingers 11H overlaps interdigitated electrode fingers 11H in direction 10A. Furthermore, interdigitated electrode fingers 11H face dummy electrode fingers 11F of comb-shaped electrode 11A in direction 10D, respectively. Dummy electrode fingers 11J of comb-shaped electrode 11B face interdigitated electrode fingers 11D of comb-shaped electrode 11A in direction 10D, respectively. Bus bar 11G has end 911B which is closest to comb-shaped electrode 11A, and extends straight in direction 10A. Bus bar 11C has end 911A which is closest to comb-shaped electrode 11B, and extends straight in direction 10A.

Comb-shaped electrode 11A further includes weighted parts 11K each of which is formed of an electrode. Weighted parts 11K are formed at spaces between interdigitated electrode fingers 11D and dummy electrode fingers 11F and in non-interdigitated region 15B outside interdigitated region 15A on surface 21A.

Comb-shaped electrode 11A further includes non-weighted part 11L formed in non-interdigitated region 15B. Outermost electrode finger 11R out of interdigitated electrode fingers 11D and dummy electrode fingers 11F is the closest to reflector electrode 12. Non-weighted part 11L is formed at the space between outermost electrode finger 11R and electrode finger 11V adjacent to outermost electrode finger 11R. No electrode is formed in non-weighted part 11L.

Comb-shaped electrode 11A further includes non-weighted part 11P formed in non-interdigitated region 15B. Outermost electrode finger 11S out of interdigitated electrode fingers 11D and dummy electrode fingers 11F is the closest to reflector electrode 13. Non-weighted part 11P is formed at a space between outermost electrode finger 11S and electrode finger 11W adjacent to outermost electrode finger 11S. No electrode is formed in non-weighted part 11P.

Comb-shaped electrode 11B further includes weighted parts 11M, which are made of the above-mentioned conductive material. Weighted parts 11M are formed at spaces between interdigitated electrode fingers 11H and dummy electrode fingers 11J in non-interdigitated region 15B on surface 21A.

Comb-shaped electrode 11B further includes non-weighted part 11N formed in non-interdigitated region 15B. Outermost electrode finger 11T out of interdigitated electrode fingers 11H and dummy electrode fingers 11J is the closest to reflector electrode 12. Non-weighted part 11N is formed at a space between outermost electrode finger 11T and electrode finger 11X adjacent to outermost electrode finger 11T. No electrode is formed in non-weighted part 11N.

Comb-shaped electrode 11B further includes non-weighted part 11Q formed in non-interdigitated region 15B. Outermost electrode finger 11U out of interdigitated electrode fingers 11H and dummy electrode fingers 11J is the closest to reflector electrode 13. Non-weighted part 11Q is formed at a space between outermost electrode finger 11U and electrode finger 11Y adjacent to outermost electrode finger 11U. No electrode is formed in non-weighted part 11Q.

Non-weighted parts 11L, 11N, 11P, and 11Q prevent short circuits between IDT electrode 11 and each of reflector electrodes 12 and 13.

In non-weighted parts 11L and 11P, short circuits may occur between outermost electrode fingers 11R and 11S and electrode fingers 11V and 11W adjacent to electrode fingers 11R and 11S, respectively. However, the possible short circuits do not affect the property of acoustic wave device 10 because outermost electrode finger 11R and electrode finger 11V have the same potential as each other, and outermost electrode finger 11S and electrode finger 11W have the same potential as each other. In non-weighted parts 11N and 11Q, short circuits may occur between outermost electrode fingers 11T and 11U and electrode fingers 11X and 11Y adjacent to electrode fingers 11T and 11U, respectively. However the possible short circuits do not affect the property of acoustic wave device 10 because outermost electrode finger 11T and electrode finger 11X have the same potential as each other, and outermost electrode finger 11U and electrode finger 11Y have the same potential as each other.

Figure 1B:
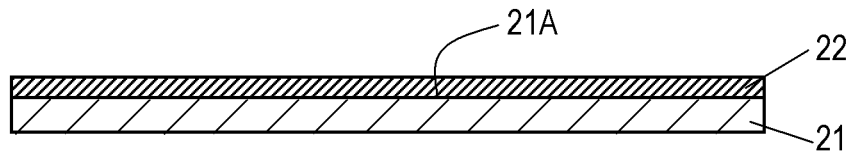
FIG. 1B is a sectional view showing a production process of the acoustic wave device according to the first exemplary embodiment.
Figure 1C:
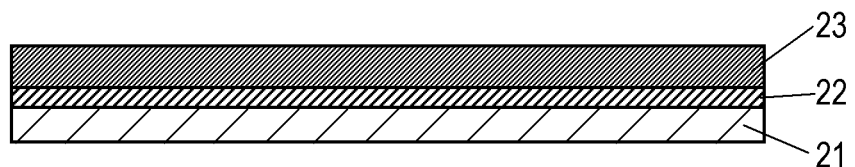
FIG. 1C is a sectional view showing a production process of the acoustic wave device according to the first exemplary embodiment.
Figure 1D:
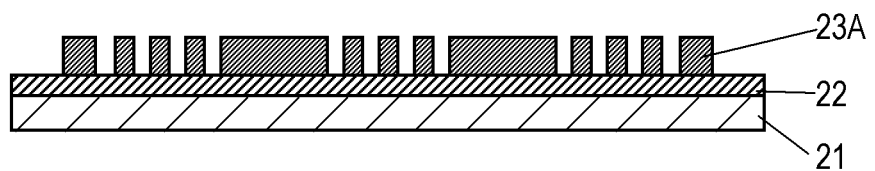
FIG. 1D is a sectional view showing a production process of the acoustic wave device according to the first exemplary embodiment.
Figure 1E:
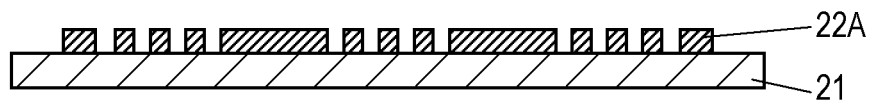
FIG. 1E is a sectional view showing a production process of the acoustic wave device according to the first exemplary embodiment.

The following is a description of a method for manufacturing acoustic wave device 10. FIGS. 1B to 1E are sectional views showing the method for manufacturing acoustic wave device 10. In FIG. 1B, electrode film 22 made of the above-mentioned conductive material is formed on surface 21A of piezoelectric substrate 21 by a method, such as deposition or sputtering. In FIG. 1C, resist film 23 is formed on the upper surface of electrode film 22. In FIG. 1D, resist film 23 is processed to have a predetermined shape by photolithography. In FIG. 1E, electrode film 22 is processed to have a predetermined shape to form IDT electrode 11, reflector electrodes 12 and 13, and other components by a method, such as dry etching, and then, resist film 23 is removed.

Figure 2A:
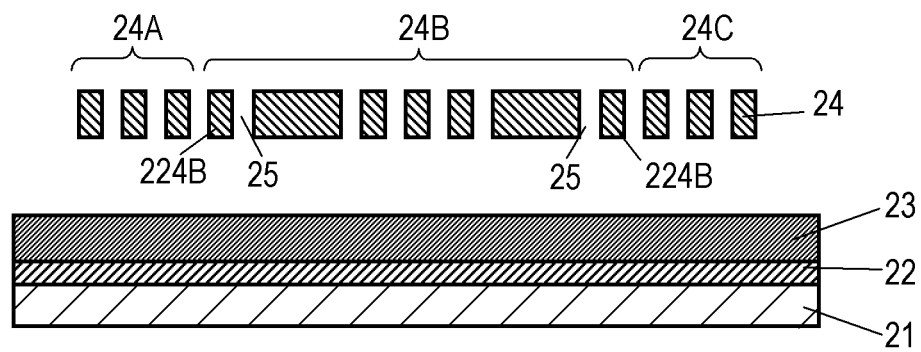
FIG. 2A is a sectional view showing a production process of the acoustic wave device according to the first exemplary embodiment.
Figure 2B:
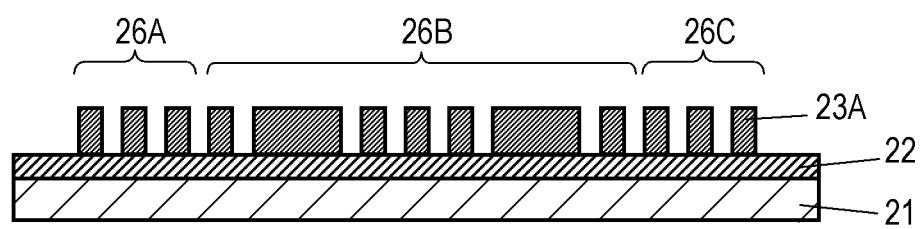
FIG. 2B is a sectional view showing a production process of the acoustic wave device according to the first exemplary embodiment.
Figure 2C:
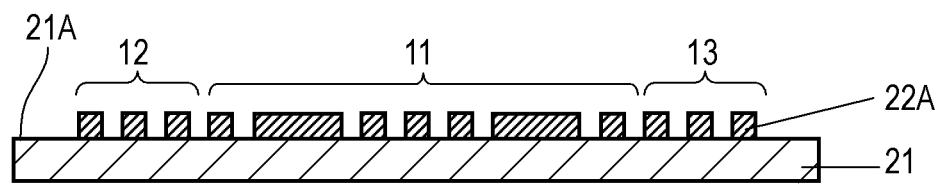
FIG. 2C is a sectional view showing a production process of the acoustic wave device according to the first exemplary embodiment.

FIGS. 2A to 2C are sectional views showing production processes of acoustic wave device 10 from the exposure of resist film 23 to its removal in a more detail than in FIGS. 1C to 1E, respectively. FIG. 2C is a sectional view taken along a line 2C-2C shown in FIG. 1A.

In FIG. 2A, mask 24 is first prepared which includes openings for transmitting light, and light-shielding portions for shielding light. Resist film 23 is exposed through mask 24 to a laser beam emitted from a light source. Mask 24 includes mask portion 24B for forming IDT electrode 11, and mask portions 24A and 24C for forming reflector electrodes 12 and 13, respectively. Mask portion 24B includes openings 25 inside light-shielding portions 224B which are arranged at opposite ends of mask portion 24B. Openings 25 form non-weighted parts 11L and 11N shown in FIG. 1A.

Figure 10A:
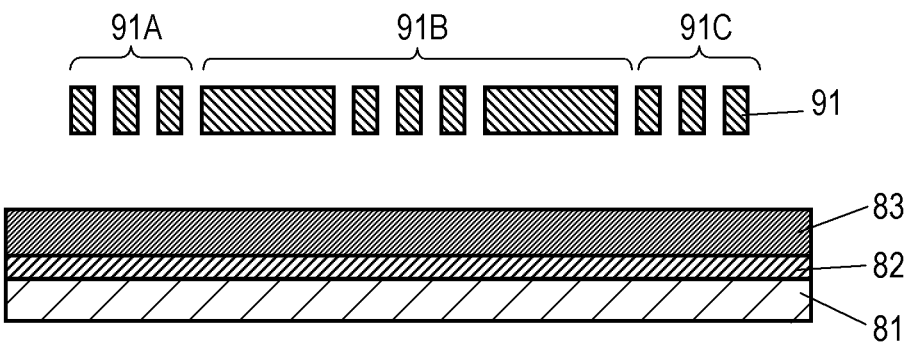
FIG. 10A is a sectional view showing a production process of the conventional acoustic wave device shown in FIG. 8B.

The ratio of the area of openings provided in a certain portion of a mask including light-shielding portions and the openings to the entire area of the certain portion is defined as an aperture ratio of the certain portion. In FIG. 10A showing mask 91 for forming conventional acoustic wave device 70B of FIG. 8B, mask portion 91B does not include openings 25 shown in FIG. 2A. Openings 25 allows an aperture ratio at and around a space between mask portion 24B and each of mask portions 24A and 24C to be larger than an aperture ratio at and around a space between mask portion 91B and each of mask portions 91A and 91C shown in FIG. 10A.

As a result, a sufficient exposure amount can be obtained, thereby preventing unwanted resist films from remaining in resist film 23A, as shown in FIG. 2B, and consequently preventing unwanted electrode films from remaining in electrode film 22A, as shown in FIG. 2C. This prevents short circuits between IDT electrode 11 and each of reflector electrodes 12 and 13.

Figure 8A:
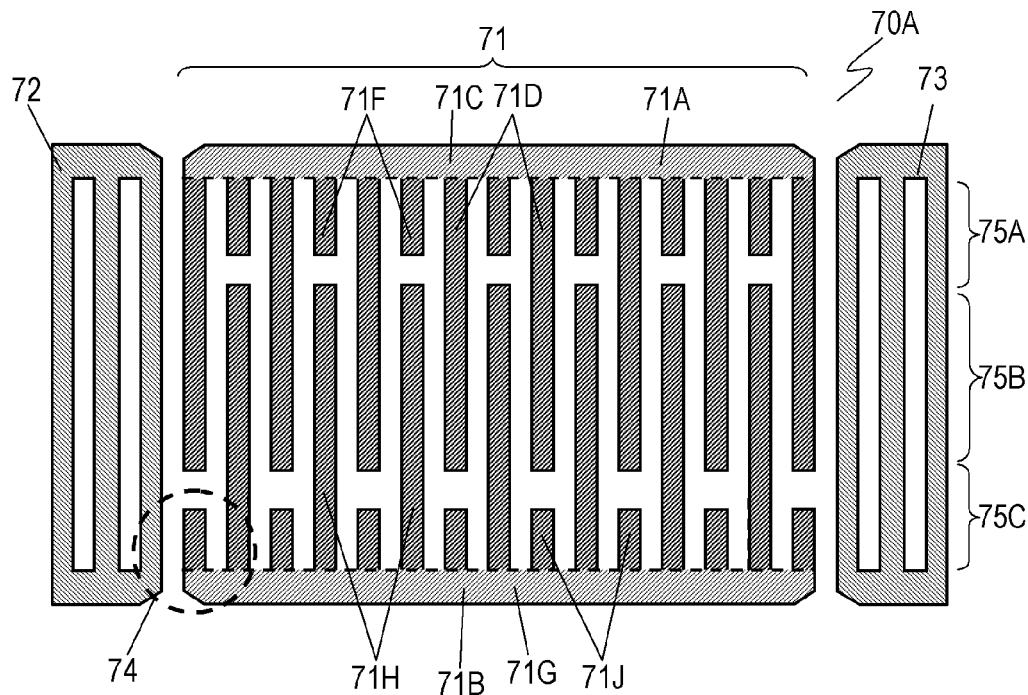
FIG. 8A is a plan view of a conventional acoustic wave device.
Figure 8B:
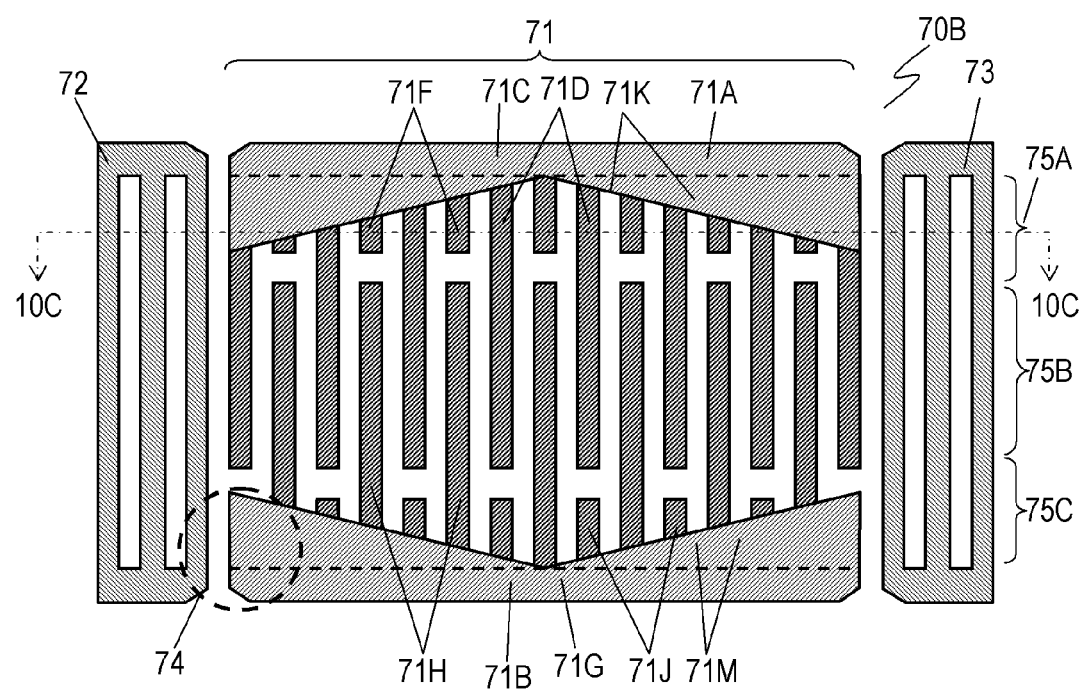
FIG. 8B is a plan view of another conventional acoustic wave device.
Figure 9A:
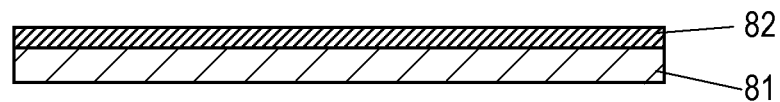
FIG. 9A is a sectional view showing a production process of the conventional acoustic wave device shown in FIG. 8B.
Figure 9B:
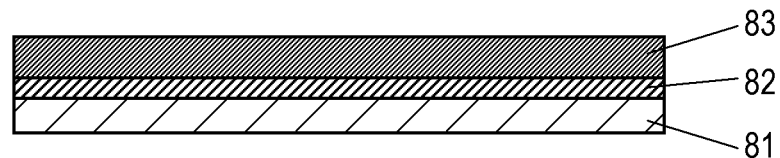
FIG. 9B is a sectional view showing a production process of the conventional acoustic wave device shown in FIG. 8B.
Figure 9C:
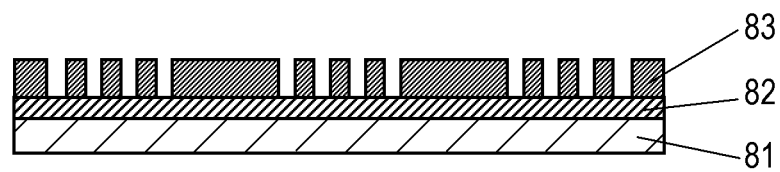
FIG. 9C is a sectional view showing a production process of the conventional acoustic wave device shown in FIG. 8B.
Figure 9D:
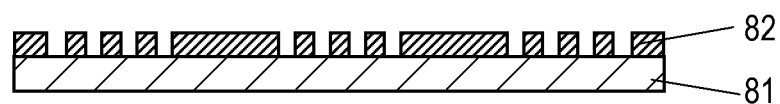
FIG. 9D is a sectional view showing a production process of the conventional acoustic wave device shown in FIG. 8B.
Figure 9E:
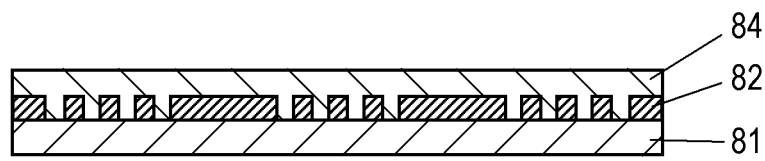
FIG. 9E is a sectional view showing a production process of the conventional acoustic wave device shown in FIG. 8B.
Figure 9F:
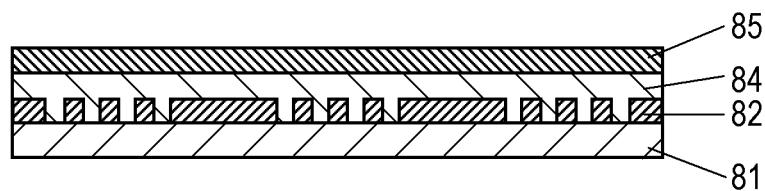
FIG. 9F is a sectional view showing a production process of the conventional acoustic wave device shown in FIG. 8B.
Figure 9G:
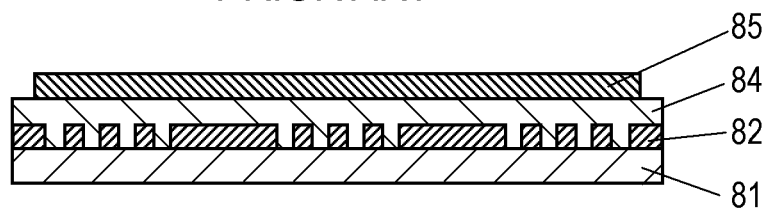
FIG. 9G is a sectional view showing a production process of the conventional acoustic wave device shown in FIG. 8B.
Figure 9H:
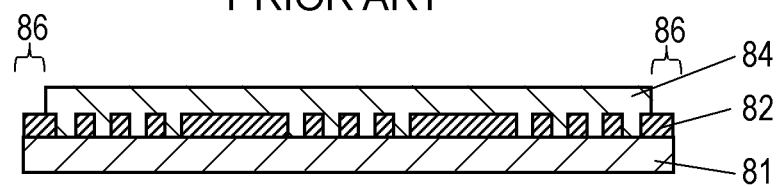
FIG. 9H is a sectional view showing a production process of the conventional acoustic wave device shown in FIG. 8B.
Figure 10B:
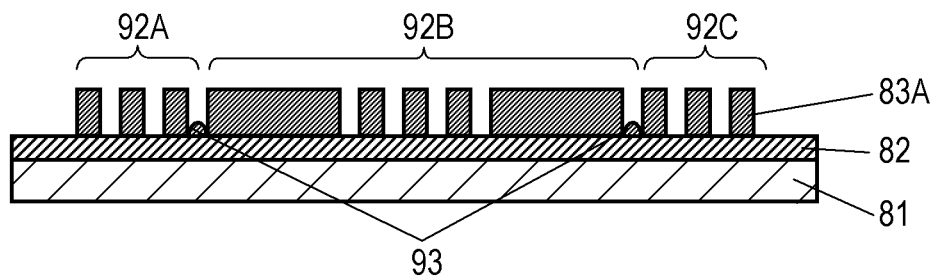
FIG. 10B is a sectional view showing a production process of the conventional acoustic wave device shown in FIG. 8B.
Figure 10C:
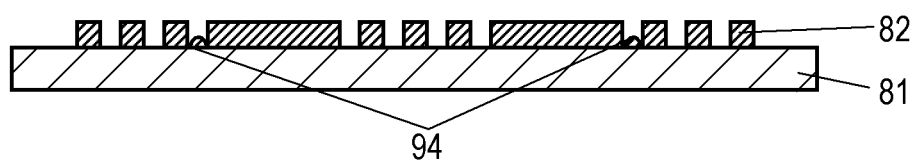
FIG. 10C is a sectional view showing a production process of the conventional acoustic wave device shown in FIG. 8B.

In conventional acoustic wave device 70B shown in FIG. 8B, resist film 83 shown in FIG. 10A becomes resist film 83A after the exposure and development, as shown in FIG. 10B. In this case, unwanted resist films 93 may remain between resist film 92B which becomes IDT electrode 71 and each of resist films 92A and 92C which become reflector electrodes 72 and 73, respectively. Weighted parts 71K reduce an aperture ratio at both ends of mask portion 91B. Thus, the aperture ratio at and around the space between mask portion 91B and each of mask portions 91A and 91C is smaller than the aperture ratio in the remaining region. As a result, the portions of resist film 83 corresponding to these spaces are insufficiently exposed to light, causing unwanted resist films 93 to remain. As acoustic wave device 70B is operated at a higher frequency, gap 74 becomes smaller, causing unwanted resist films 93 to be likely to remain.

In acoustic wave device 10 of the first exemplary embodiment shown in FIG. 1A, non-weighted parts 11L, 11N, 11P, and 11Q increase aperture ratios at gap 14 between IDT electrode 11 and reflector electrode 12 and at the gap between IDT electrode 11 and reflector electrode 13. This prevents short circuits between IDT electrode 11 and each of reflector electrodes 12 and 13.

In comb-shaped electrodes 11A and 11B of acoustic wave device 10 of the first exemplary embodiment, non-weighted parts 11L, 11N, 11P, and 11Q are formed between outermost electrode finger 11R and electrode finger 11V, between outermost electrode finger 11T and electrode finger 11X, between outermost electrode finger 11S and electrode finger 11W, and between outermost electrode finger 11U and electrode finger 11Y. In comb-shaped electrodes 11A and 11B of acoustic wave device 10 of the first exemplary embodiment, non-weighted parts having no electrodes therein may alternatively be formed in the spaces between electrode finger 11V and the electrode finger inwardly adjacent to electrode finger 11V, between electrode finger 11W and the electrode finger inwardly adjacent to electrode finger 11W, between electrode finger 11X and the electrode finger inwardly adjacent to electrode finger 11X, and between electrode finger 11Y and the electrode finger inwardly adjacent to electrode finger 11Y. This structure further increases the aperture ratio, thereby reducing degradation of the yield due to short circuits between IDT electrode 11 and each of reflector electrodes 12 and 13.

As shown in FIG. 1A, weighted parts 11K may have widths gradually increasing in direction 10B from the center of bus bar 11C toward reflector electrodes 12 and 13, and weighted parts 11M may have widths gradually increasing in direction 10B from the center of bus bar 11G toward reflector electrodes 12 and 13. This suppresses unwanted waves. In conventional acoustic wave device 70B, if weighted parts 11K and 11M have large widths in the portions of IDT electrode 71 that are close to reflector electrodes 72 and 73, short circuits may occur between IDT electrode 11 and each of reflector electrodes 12 and 13. In acoustic wave device 10 of the first exemplary embodiment, on the other hand, non-weighted parts 11L and 11N prevent short circuits between IDT electrode 11 and each of reflector electrodes 12 and 13, thereby increasing production yield and effectively suppressing unwanted waves.

Non-weighted parts 11L and 11N cause the widths of weighted parts 11K and 11M for confining unwanted waves to be discontinuous at their outermost sides, thereby effectively scattering unwanted waves. Thus, acoustic wave device 10 of the first exemplary embodiment can suppress unwanted waves more greatly than conventional acoustic wave device 70B shown in FIG. 8B.

In the case that the distances between the IDT electrode and each of the reflector electrodes are not more than the distance between the interdigitated electrode fingers adjacent to each other and the distances between the dummy electrode fingers adjacent to each other, conventional acoustic wave device 70B shown in FIG. 8B may cause short circuits likely between IDT electrode 71 and each of reflector electrodes 72 and 73. In acoustic wave device 10 of the first exemplary embodiment, on the other hand, even if the distances are not more than the distances between the interdigitated electrode fingers adjacent to each other and the distances between the dummy electrode fingers adjacent to each other, the possible short circuits between IDT electrode 11 and each of reflector electrodes 12 and 13 can be prevented.

Piezoelectric substrate 21 made of lithium niobate ($LiNbO_3$) can increase the electromechanical coupling coefficient of acoustic wave device 10, thereby providing low-loss acoustic wave device 10. In this case, however, transverse mode components, which are unwanted waves, also have a large electromechanical coupling coefficient. This makes it necessary to suppress the transverse mode components by providing weighted parts 11K and 11M with larger widths. Thus, in conventional acoustic wave device 70B shown in FIG. 8B, piezoelectric substrate made of $LiNbO_3$ may cause more likely short circuits between IDT electrode 71 and each of reflector electrodes 72 and 73. Acoustic wave device 10 of the first exemplary embodiment, on the other hand, can prevent short circuits between IDT electrode 11 and each of reflector electrodes 12 and 13, and have excellent unwanted wave suppression characteristics.

Figure 2D:
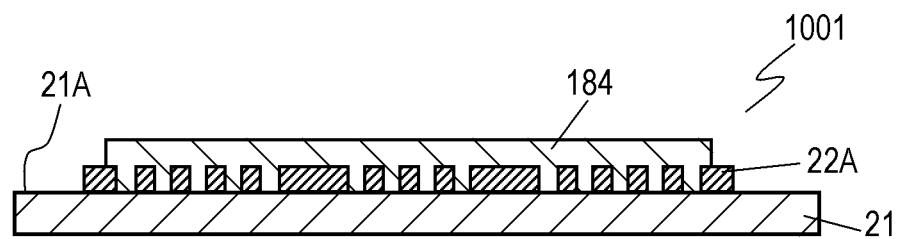
FIG. 2D is a sectional view of another acoustic wave device according to the first exemplary embodiment.

FIG. 2D is a sectional view of another acoustic wave device 1001 of the first exemplary embodiment. In FIG. 2D, components identical to those of acoustic wave device 10 shown in FIGS. 1A and 2C are denoted by the same reference numerals. Acoustic wave device 10 is manufactured by the production processes shown in FIGS. 2A to 2C. Then, protective film 184 made of a dielectric thin film, such as $SiO_2$, is formed on IDT electrode 11 to coat IDT electrode 11 and reflector electrodes 12 and 13 on surface 21A of piezoelectric substrate 21 in the same method as manufacturing conventional acoustic wave device 70B shown in FIGS. 9E to 9H. In acoustic wave device 1001, piezoelectric substrate 21 is a Y-cut $LiNbO_3$ substrate of Y-cut angle ranging from −15° to +15°. Acoustic wave device 1001 and an acoustic wave filter using it have excellent temperature characteristics in a wide frequency range, but are likely to have transverse mode spurious responses. In addition, protective film 184 made of a dielectric thin film, such as $SiO_2$, reduces the sound speed of the acoustic wave, thereby narrowing the pitch of IDT electrode 11 and the distances between IDT electrode 11 and each of reflector electrodes 12 and 13. In acoustic wave device 1001, however, weighted parts 11K and 11M suppress spurious responses, and non-weighted parts 11L, 11N, 11P, and 11Q can prevent short circuits between IDT electrode 11 and each of reflector electrodes 12 and 13.

Figure 2E:
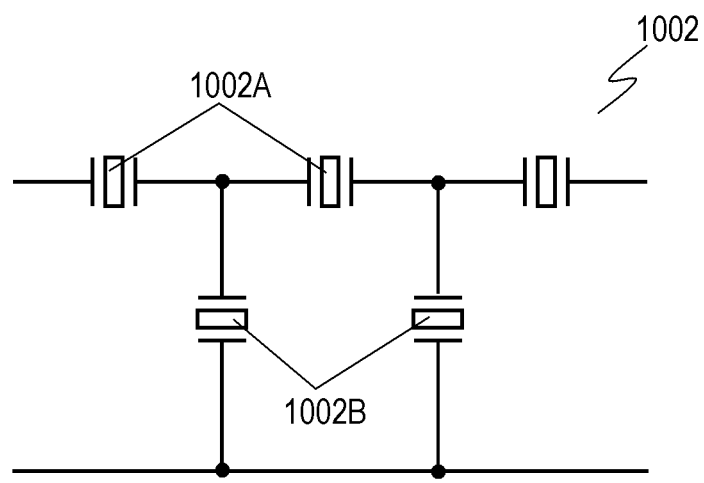
FIG. 2E is a circuit diagram of an acoustic wave filter according to the first exemplary embodiment.

FIG. 2E is a circuit diagram of acoustic wave filter 1002 of the first exemplary embodiment. Acoustic wave filter 1002 is a ladder type acoustic wave filter in which series-arm acoustic wave devices 1002A and parallel-arm acoustic wave devices 1002B are connected to each other. Each of acoustic wave devices 1002A and 1002B is acoustic wave device 10 (1001). Acoustic wave filter 1002 can prevent short circuits between electrodes, thereby preventing property degradation of acoustic wave device 1002 due to short circuits.

Second Exemplary Embodiment

Figure 3:
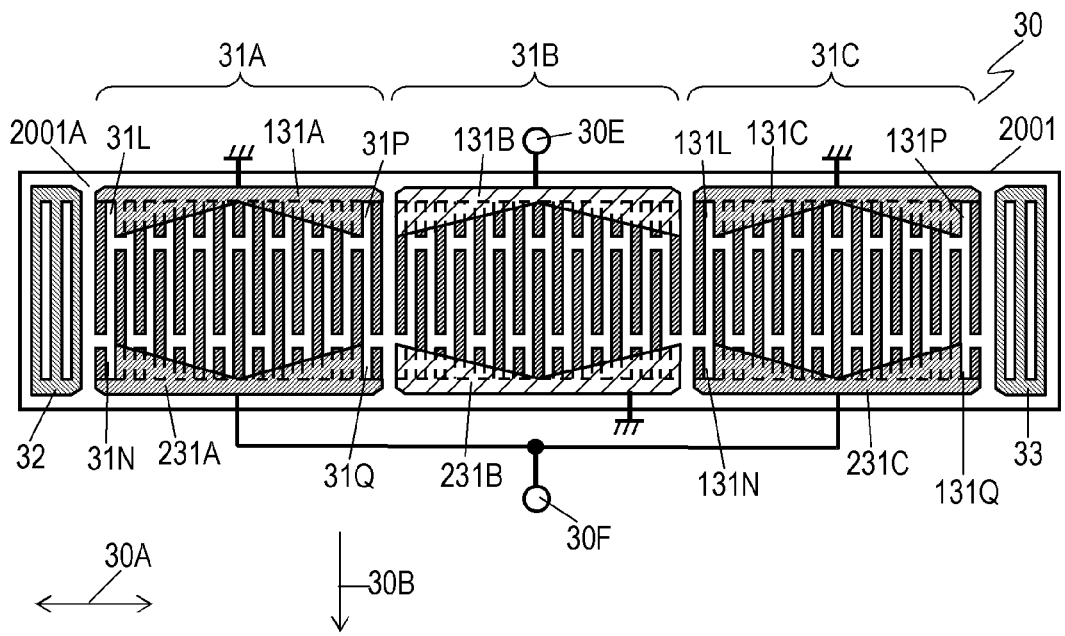
FIG. 3 is a plan view of an acoustic wave filter according to a second exemplary embodiment of the present invention.

FIG. 3 is a plan view of acoustic wave filter 30 of a second exemplary embodiment of the present invention. Acoustic wave filter 30 includes piezoelectric substrate 2001 having surface 2001A along which an acoustic wave propagates, IDT electrodes 31A, 31B, and 31C, and reflector electrodes 32 and 33. These electrodes are arranged on surface 2001A of piezoelectric substrate 2001 in direction 30A along which the acoustic wave propagates. In acoustic wave filter 30, a signal is input to IDT electrode 31B and output from IDT electrodes 31A and 31C. IDT electrode 31A includes comb-shaped electrodes 131A and 231A facing each other in direction 30B which is different from or substantially perpendicular to direction 30A. IDT electrode 31B includes comb-shaped electrodes 131B and 231B facing each other in direction 30B. IDT electrode 31C includes comb-shaped electrodes 131C and 231C facing each other in direction 30B. A signal is input to input terminal 30E and output from output terminal 30F. Input terminal 30E is connected to comb-shaped electrode 131B of IDT electrode 31B. Output terminal 30F is connected to comb-shaped electrodes 231A and 231C of IDT electrodes 31A and 31C. Comb-shaped electrodes 131A, 231B, and 131C of IDT electrodes 31A to 31C are grounded, i.e., connected to a ground.

Comb-shaped electrodes 131A and 231A of IDT electrode 31A face reflector electrode 32 in direction 30A. Comb-shaped electrodes 131A and 231A face comb-shaped electrodes 131B and 231B of IDT electrode 31B in direction 30A, respectively. Comb-shaped electrodes 131B and 231B of IDT electrode 31B face comb-shaped electrodes 131C and 231C of IDT electrode 31C in direction 30A, respectively. Comb-shaped electrodes 131C and 231C of IDT electrode 31C face reflector electrode 33 in direction 30A.

IDT electrodes 31A and 31C have the same structure as IDT electrode 11 of the first exemplary embodiment shown in FIG. 1A. IDT electrode 31B has the same structure as conventional acoustic wave device 70B shown in FIG. 8B, but may alternatively have the same structure as IDT electrode 11 of the first exemplary embodiment shown in FIG. 1A.

The positional relationship between IDT electrode 31A, reflector electrode 32, and IDT electrode 31B in acoustic wave filter 30 is the same as between IDT electrode 11, reflector electrode 12 as a separate electrode, and reflector electrode 13 as another separate electrode in acoustic wave device 10 of the first exemplary embodiment shown in FIG. 1A. In IDT electrode 31A, as in IDT electrode 11 of the first exemplary embodiment, comb-shaped electrode 131A includes non-weighted parts 31L and 31P having the same structure as non-weighted parts 11L and 11P of comb-shaped electrode 11A shown in FIG. 1A. This can prevent short circuits between comb-shaped electrode 131A and each of reflector electrode 32 and comb-shaped electrode 131B of IDT electrode 31B as a separate electrode adjacent to comb-shaped electrode 131A.

Comb-shaped electrode 231A includes non-weighted parts 31N and 31Q having the same structure as non-weighted parts 11N and 11Q of comb-shaped electrode 11B shown in FIG. 1A. This can prevent short circuits between comb-shaped electrode 231A and each of reflector electrode 32 and comb-shaped electrode 231B of IDT electrode 31B as a separate electrode adjacent to comb-shaped electrode 231A.

The positional relationship between IDT electrode 31C, IDT electrode 31B, and reflector electrode 33 in acoustic wave filter 30 is the same as between IDT electrode 11, reflector electrode 12 as a separate electrode, and reflector electrode 13 as another separate electrode in acoustic wave device 10 of the first exemplary embodiment shown in FIG. 1A. In IDT electrode 31C, as in IDT electrode 11 of the first exemplary embodiment, comb-shaped electrode 131C includes non-weighted parts 131L and 131P having the same structure as non-weighted parts 11L and 11P of comb-shaped electrode 11A shown in FIG. 1A. This can prevent short circuits between comb-shaped electrode 131C and each of reflector electrode 32 and comb-shaped electrode 131B of IDT electrode 31B as a separate electrode adjacent to comb-shaped electrode 131C.

Comb-shaped electrode 231C includes non-weighted parts 131N and 131Q having the same structure as non-weighted parts 11N and 11Q of comb-shaped electrode 11B shown in FIG. 1A. This can prevent short circuits between comb-shaped electrode 231C and each of reflector electrode 33 and comb-shaped electrode 231B of IDT electrode 31B as a separate electrode adjacent to comb-shaped electrode 231C.

IDT electrodes 31A and 31C arranged at opposite sides of IDT electrode 31B includes non-weighted parts, thereby providing a large aperture ratio in at spaces between IDT electrodes 31A and 31B and between IDT electrodes 31C and 31B. Therefore, comb-shaped electrodes 131B and 231B of IDT electrode 31B do not necessarily include non-weighted parts.

Figure 4:
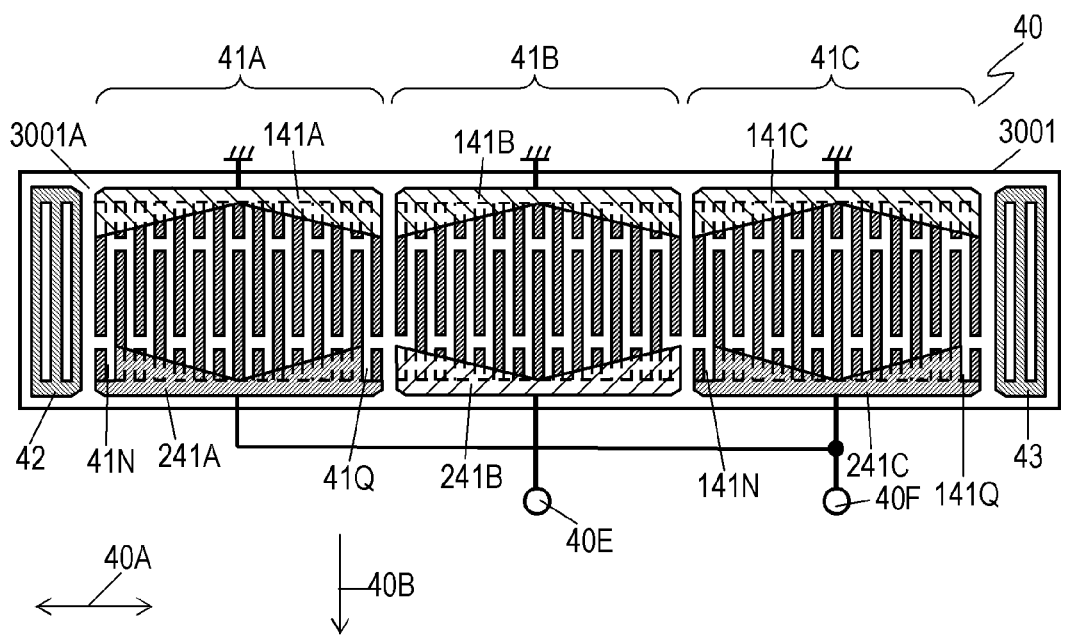
FIG. 4 is a plan view of another acoustic wave filter according to the second exemplary embodiment.

FIG. 4 is a plan view of another acoustic wave filter 40 of the second exemplary embodiment. Acoustic wave filter 40 includes piezoelectric substrate 3001 having surface 3001A along which an acoustic wave propagates, IDT electrodes 41A, 41B, and 41C, and reflector electrodes 42 and 43. These electrodes are arranged on surface 3001A of piezoelectric substrate 3001 in direction 40A along which the acoustic wave propagates. In acoustic wave filter 40, a signal is input to IDT electrode 41B and output from IDT electrodes 41A and 41C. IDT electrode 41A includes comb-shaped electrodes 141A and 241A facing each other in direction 40B which is different from or substantially perpendicular to direction 40A. IDT electrode 41B includes comb-shaped electrodes 141B and 241B facing each other in direction 40B. IDT electrode 41C includes comb-shaped electrodes 141C and 241C facing each other in direction 40B. A signal is input to input terminal 40E and output from output terminal 40F. Input terminal 40E is connected to comb-shaped electrode 241B of IDT electrode 41B. Output terminal 40F is connected to comb-shaped electrodes 241A and 241C of IDT electrodes 41A and 41C. Comb-shaped electrodes 141A, 141B, and 141C of IDT electrodes 41A to 41C are grounded, i.e., connected to a ground.

Comb-shaped electrodes 141A and 241A of IDT electrode 41A face reflector electrode 42 in direction 40A. Comb-shaped electrodes 141A and 241A face comb-shaped electrodes 141B and 241B of IDT electrode 41B in direction 40A, respectively. Comb-shaped electrodes 141B and 241B of IDT electrode 41B face comb-shaped electrodes 141C and 241C of IDT electrode 41C in direction 40A, respectively. Comb-shaped electrodes 141C and 241C of IDT electrode 41C face reflector electrode 43 in direction 40A.

Comb-shaped electrodes 141A and 141C of IDT electrodes 41A and 41C have the same structure as comb-shaped electrode 71A of IDT electrode 71 of conventional acoustic wave device 70B shown in FIG. 8B. Comb-shaped electrodes 241A and 241C of IDT electrodes 41A and 41C have the same structure as comb-shaped electrode 11B of IDT electrode 11 of acoustic wave device 10 of the first exemplary embodiment shown in FIG. 1A. IDT electrode 41B has the same structure as conventional acoustic wave device 70B shown in FIG. 8B.

The positional relationship between IDT electrode 41A, reflector electrode 42, and IDT electrode 41B in acoustic wave filter 40 is the same as between IDT electrode 11, reflector electrode 12 as a separate electrode, and reflector electrode 13 as another separate electrode in acoustic wave device 10 of the first exemplary embodiment shown in FIG. 1A. In IDT electrode 41A, as in IDT electrode 11 of the first exemplary embodiment, comb-shaped electrode 241A includes non-weighted parts 41N and 41Q having the same structure as non-weighted parts 11N and 11Q of comb-shaped electrode 11B shown in FIG. 1A. This can prevent short circuits between comb-shaped electrode 241A and each of reflector electrode 42 and comb-shaped electrode 241B of IDT electrode 41B as a separate electrode adjacent to comb-shaped electrode 241A.

The positional relationship between IDT electrode 41C, IDT electrode 41B, and reflector electrode 43 in acoustic wave filter 40 is the same as between IDT electrode 11, reflector electrode 12 as a separate electrode, and reflector electrode 13 as a separate electrode in acoustic wave device 10 of the first exemplary embodiment shown in FIG. 1A. In IDT electrode 41C, as in IDT electrode 11 of the first exemplary embodiment, comb-shaped electrode 241C includes non-weighted parts 141N and 141Q having the same structure as non-weighted parts 11N and 11Q of comb-shaped electrode 11B shown in FIG. 1A. This can prevent short circuits between comb-shaped electrode 241C and each of reflector electrode 42 and comb-shaped electrode 241B of IDT electrode 41B as a separate electrode adjacent to comb-shaped electrode 241C.

In acoustic wave filter 40 shown in FIG. 4, comb-shaped electrodes 141A to 141C of IDT electrodes 41A to 41C have the same structure as comb-shaped electrode 71A of IDT electrode 71 of conventional acoustic wave device 70B shown in FIG. 8B, and do not include non-weighted parts. Comb-shaped electrodes 141A to 141C are grounded and have the same potential as each other. Therefore, even if short circuits occur due to the absence of non-weighted parts, it does not affect the property of acoustic wave filter 40.

Third Exemplary Embodiment

Figure 5A:
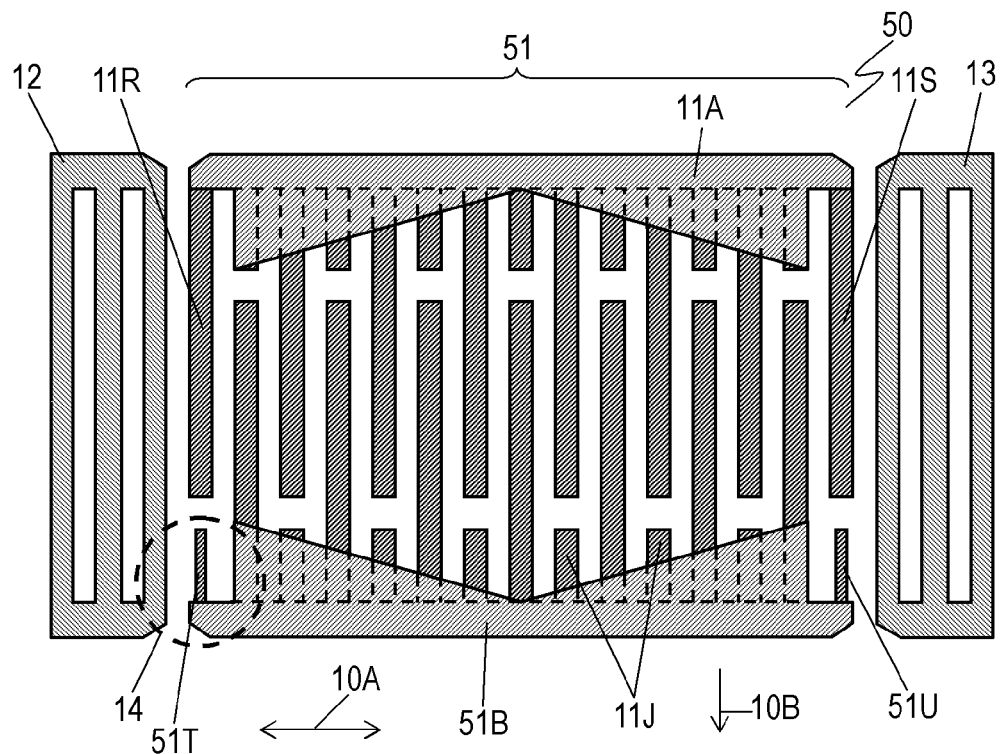
FIG. 5A is a plan view of an acoustic wave filter according to a third exemplary embodiment of the present invention.

FIG. 5A is a plan view of acoustic wave device 50 of a third exemplary embodiment of the present invention. In FIG. 5A, components identical to those of acoustic wave device 10 of the first exemplary embodiment shown in FIG. 1 are denoted by the same reference numerals. Acoustic wave device 50 includes IDT electrode 51 instead of IDT electrode 11 of acoustic wave device 10 of the first exemplary embodiment shown in FIG. 1A. IDT electrode 51 includes comb-shaped electrode 51B instead of comb-shaped electrode 11B of IDT electrode 11 of the first exemplary embodiment shown in FIG. 1A. Comb-shaped electrode 51B is disposed at the same position as comb-shaped electrode 11B. Comb-shaped electrode 51B includes outermost dummy electrode fingers 51T and 51U instead of outermost dummy electrode fingers 11T and 11U of comb-shaped electrode 11B shown in FIG. 1A. Outermost dummy electrode fingers 51T and 51U have smaller widths in direction 10A than dummy electrode fingers 11J. As a result, the aperture ratio at gap 14 can be larger than that of acoustic wave device 10 of the first exemplary embodiment. This can prevent short circuits between IDT electrode 51 and each of reflector electrodes 12 and 13 which are separate electrodes.

Figure 5B:
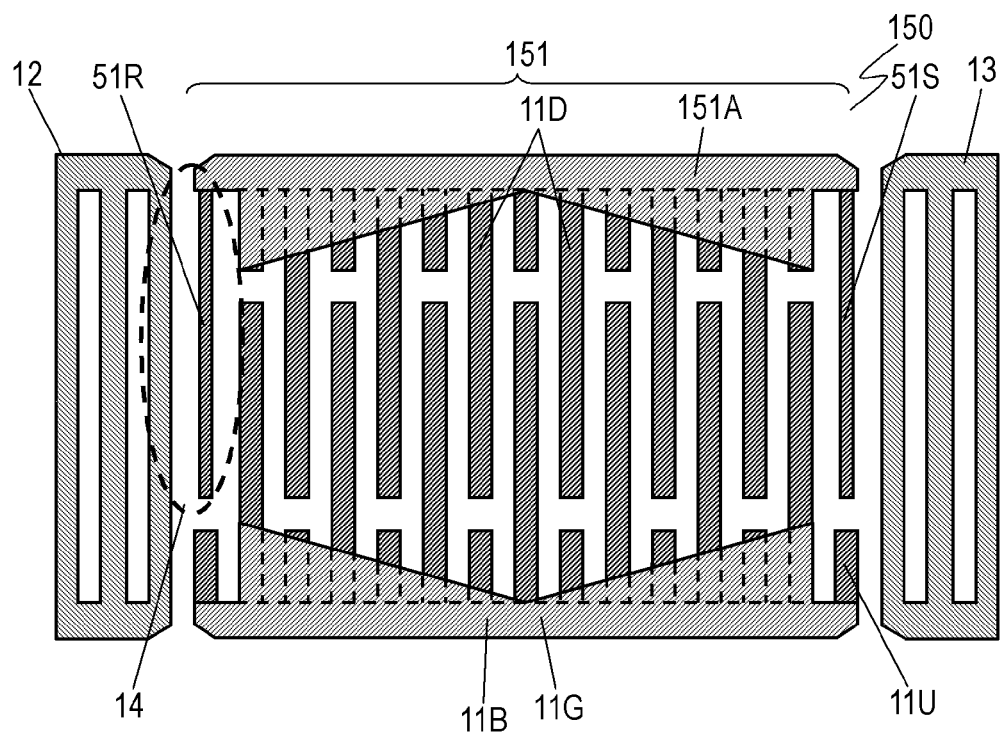
FIG. 5B is a plan view of another acoustic wave filter according to the third exemplary embodiment.

FIG. 5B is a plan view of another acoustic wave device 150 of the third exemplary embodiment. In FIG. 5B, components identical to those of acoustic wave device 10 of the first exemplary embodiment shown in FIG. 1 are denoted by the same reference numerals. Acoustic wave device 150 includes IDT electrode 151 instead of IDT electrode 11 of acoustic wave device 10 of the first exemplary embodiment shown in FIG. 1A. IDT electrode 151 includes comb-shaped electrode 151A instead of comb-shaped electrode 11A of IDT electrode 11 of the first exemplary embodiment shown in FIG. 1A. Comb-shaped electrode 151A is disposed at the same position as comb-shaped electrode 11A. Comb-shaped electrode 151A includes outermost interdigitated electrode fingers 51R and 51S instead of outermost interdigitated electrode fingers 11R and 11S of comb-shaped electrode 11A shown in FIG. 1A. Outermost interdigitated electrode fingers 51R and 51S have smaller widths in direction 10A than interdigitated electrode fingers 11D. As a result, the aperture ratio at gap 14 can be larger than that of acoustic wave device 10 of the first exemplary embodiment. This can prevent short circuits between IDT electrode 151 and each of reflector electrodes 12 and 13 which are separate electrodes.

Figure 5C:
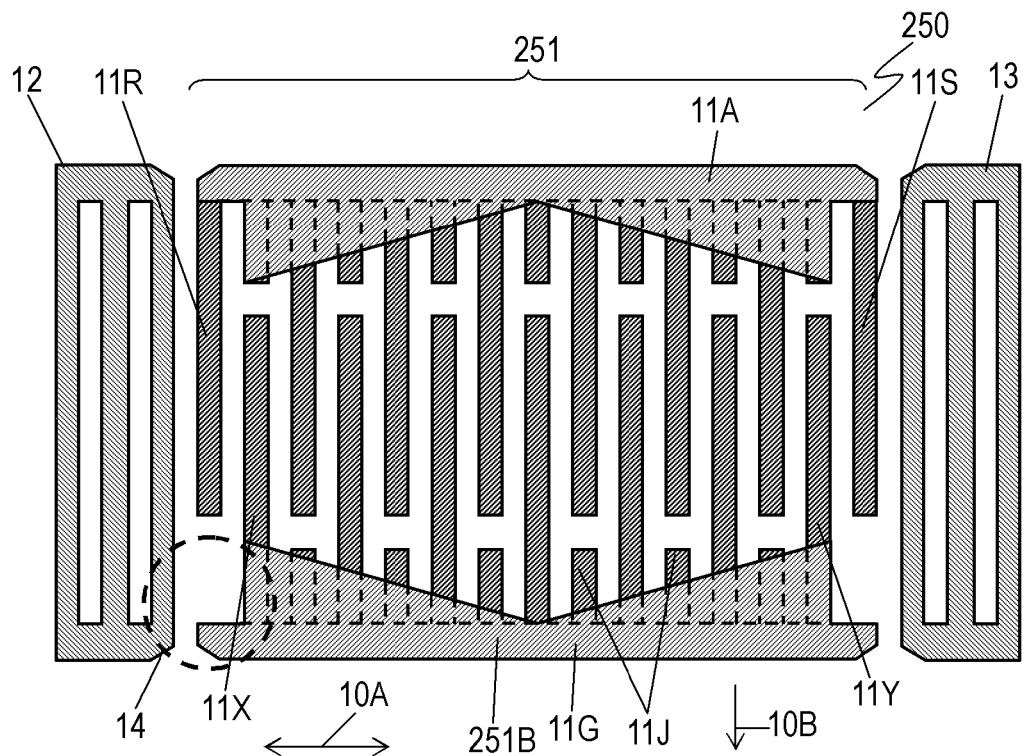
FIG. 5C is a plan view of still another acoustic wave filter according to the third exemplary embodiment.

FIG. 5C is a plan view of still another acoustic wave device 250 of the third exemplary embodiment. In FIG. 5C, components identical to those of acoustic wave device 10 of the first exemplary embodiment shown in FIG. 1 are denoted by the same reference numerals. Acoustic wave device 250 includes IDT electrode 251 instead of IDT electrode 11 of acoustic wave device 10 of the first exemplary embodiment shown in FIG. 1A. IDT electrode 251 includes comb-shaped electrode 251B instead of comb-shaped electrode 11B of IDT electrode 11 of the first exemplary embodiment shown in FIG. 1A. Comb-shaped electrode 251B is disposed at the same position as comb-shaped electrode 11B. Comb-shaped electrode 251B does not include outermost dummy electrode fingers 11T and 11U of comb-shaped electrode 11B shown in FIG. 1A. Therefore, reflector electrode 12 which is a separate electrode faces outermost interdigitated electrode fingers 11R and 11X. Bus bar 11G extends toward reflector electrode 12 beyond outermost interdigitated electrode finger 11X. Outermost interdigitated electrode finger 11R faces bus bar 11G in direction 10B. Reflector electrode 13 which is a separate electrode faces outermost interdigitated electrode fingers 11S and 11Y. Bus bar 11G extends toward reflector electrode 13 beyond outermost interdigitated electrode finger 11Y. Outermost interdigitated electrode finger 11S faces bus bar 11G in direction 10B. As a result, the aperture ratio at gap 14 can be larger than that of acoustic wave device 10 of the first exemplary embodiment. This can prevent short circuits between IDT electrode 251 and each of reflector electrodes 12 and 13 which are separate electrodes.

Figure 6A:
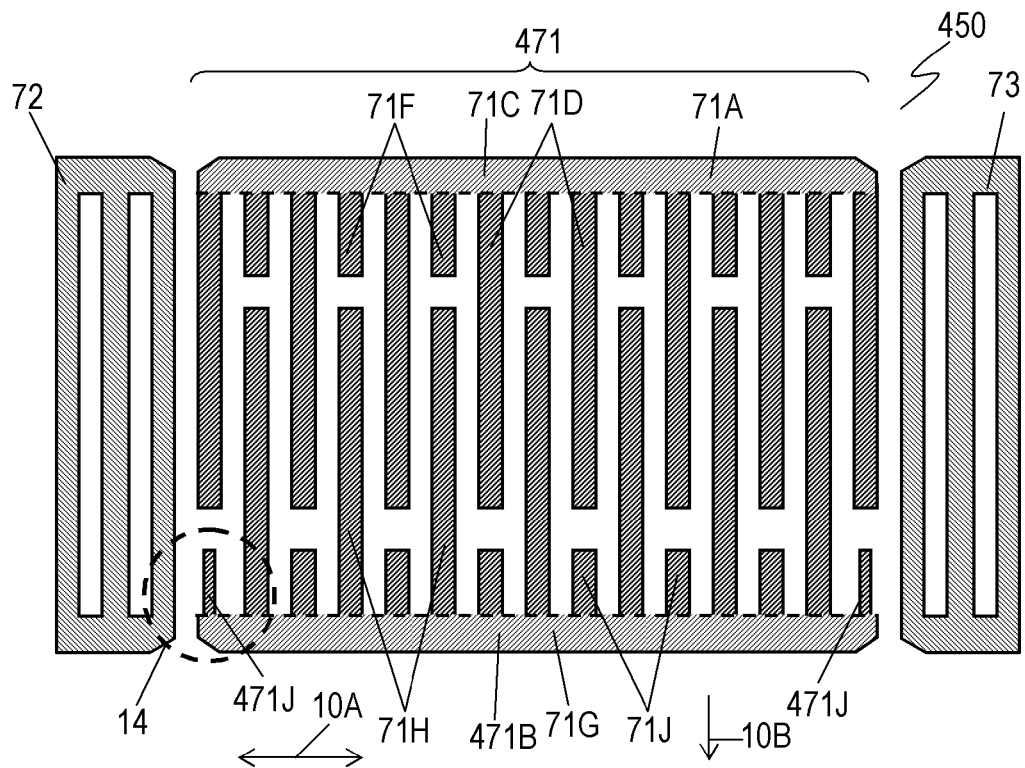
FIG. 6A is a plan view of a further acoustic wave filter according to the third exemplary embodiment.

FIG. 6A is a plan view of further acoustic wave device 450 of the third exemplary embodiment. In FIG. 6A, components identical to those of conventional acoustic wave device 70A shown in FIG. 8A are denoted by the same reference numerals. An acoustic wave propagates in direction 10A. Acoustic wave device 450 includes IDT electrode 471 instead of IDT electrode 71 of conventional acoustic wave device 70A shown in FIG. 8A. IDT electrode 471 includes comb-shaped electrode 471B instead of comb-shaped electrode 71B of conventional IDT electrode 71 shown in FIG. 8A. Comb-shaped electrode 471B is disposed at the same position as comb-shaped electrode 71B. Comb-shaped electrodes 71A and 471B do not include weighted parts 11K and 11M of IDT electrodes 11A and 11B of acoustic wave device 10 of the first exemplary embodiment shown n FIG. 1A. Even in this case, if the distance between IDT electrode 71 and each of reflector electrodes 72 and 73 in conventional acoustic wave device 70B is small, short circuits may likely occur between the IDT electrode and each of the reflector electrodes. In FIG. 6A, comb-shaped electrode 471B includes outermost dummy electrode finger 471J having a smaller width in direction 10A than interdigitated electrode fingers 71H and dummy electrode fingers 71J other than dummy electrode finger 471J. This can prevent short circuits between IDT electrode 471 and each of reflector electrodes 72 and 73 which are separate electrodes.

FIG. 6B is a plan view of further acoustic wave device 550 of the third exemplary embodiment. In FIG. 6B, components identical to those of conventional acoustic wave device 70A shown in FIG. 8A are denoted by the same reference numerals. An acoustic wave propagates in direction 10A. Acoustic wave device 550 includes IDT electrode 571 instead of IDT electrode 71 of conventional acoustic wave device 70A shown in FIG. 8A. IDT electrode 571 includes comb-shaped electrode 571A instead of comb-shaped electrode 71A of conventional IDT electrode 71 shown in FIG. 8A. Comb-shaped electrode 571A is disposed at the same position as comb-shaped electrode 71A. Comb-shaped electrodes 71A, and 71B do not include weighted parts 11K and 11M of IDT electrodes 11A and 11B of acoustic wave device 10 of the first exemplary embodiment shown in FIG. 1A. Even in this case, when the distance between IDT electrode 71 and each of reflector electrodes 72 and 73 in conventional acoustic wave device 70A is small, short circuits likely occur between the IDT electrode and each of the reflector electrodes. In FIG. 6B, comb-shaped electrode 571A includes outermost interdigitated electrode finger 571R having a smaller width in direction 10A than other electrode fingers. This can prevent short circuits between IDT electrode 571 and each of reflector electrodes 72 and 73 which are separate electrodes.

FIG. 6C is a plan view of further acoustic wave device 650 of the third exemplary embodiment. In FIG. 6C, components identical to those of conventional acoustic wave device 70A shown in FIG. 8A are denoted by the same reference numerals. An acoustic wave propagates in direction 10A. Acoustic wave device 650 includes IDT electrode 671 instead of IDT electrode 71 of conventional acoustic wave device 70A shown in FIG. 8A. IDT electrode 671 includes comb-shaped electrode 671B instead of comb-shaped electrode 71B of conventional IDT electrode 71 shown in FIG. 8A. Comb-shaped electrode 671B is disposed at the same position as comb-shaped electrode 71B. Comb-shaped electrodes 71A, and 71B do not include weighted parts 11K and 11M of IDT electrodes 11A and 11B of acoustic wave device 10 of the first exemplary embodiment shown in FIG. 1A. Comb-shaped electrode 671B does not include the outermost dummy electrode fingers of comb-shaped electrode 71B shown in FIG. 8A. In other words, reflector electrode 72 as a separate electrode faces an outermost interdigitated electrode finger of comb-shaped electrode 71A and an outermost interdigitated electrode finger of comb-shaped electrode 671B. Bus bar 71G extends toward reflector electrodes 72 and 73 beyond the outermost interdigitated electrode fingers. The outermost interdigitated electrode fingers face bus bar 71G in direction 10B. This can prevent short circuits between IDT electrode 671 and each of reflector electrodes 72 and 73 which are separate electrodes.

Fourth Exemplary Embodiment

Figure 7A:
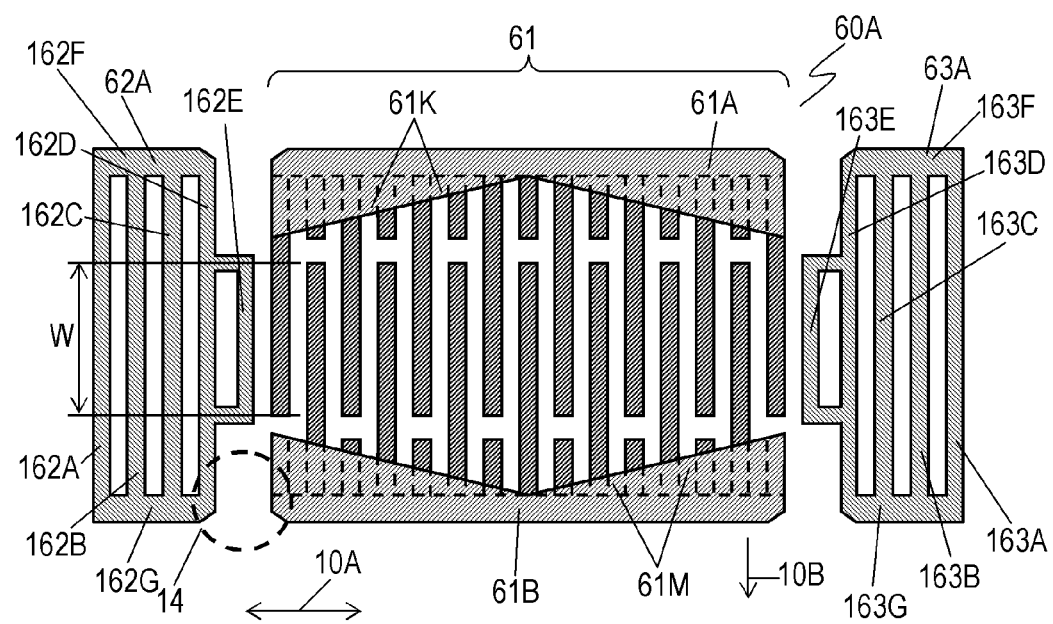
FIG. 7A is a plan view of an acoustic wave filter according to a fourth exemplary embodiment of the present invention.

FIG. 7A is a plan view of acoustic wave device 60A of a fourth exemplary embodiment of the present invention. In FIG. 7A, components identical to those of acoustic wave device 10 of the first exemplary embodiment shown in FIG. 1A are denoted by the same reference numerals. Acoustic wave device 60A includes IDT electrode 61 and reflector electrodes 62A, 63A instead of IDT electrode 11 and reflector electrodes 12 and 13 of acoustic wave device 10 of the first exemplary embodiment shown in FIG. 1A. IDT electrode 61 includes comb-shaped electrodes 61A and 61B facing each other in direction 10B different from or substantially perpendicular to direction 10A along which an acoustic wave propagates. Comb-shaped electrodes 61A and 61B include weighted parts 61K and 61M, respectively, at spaces between the interdigitated electrode fingers and the dummy electrode fingers. Weighted parts 61K and 61M are made of electrodes. Comb-shaped electrodes 61A and 61B may include non-weighted parts 11L, 11N, 11P, and 11Q of comb-shaped electrodes 11A and 11B shown in FIG. 1A. In IDT electrode 61, comb-shaped electrodes 61A and 61B are interdigitated with each other within interdigitating width W. In other words, comb-shaped electrodes 61A and 61B overlap each other in direction 10B within the interdigitating width W.

Reflector electrode 62A includes reflector electrode fingers 162A, 162B, 162C, 162D, and 162E extending in direction 10B, and bus bars 162F and 162G. Bus bar 162F is connected with respective one ends of these reflector electrode fingers, and bus bar 162G is connected with respective other ends of these reflector electrode fingers. Reflector electrode finger 162E out of reflector electrode fingers 162A to 162E to IDT electrode 61, has a smaller width in direction 10B than other reflector electrode fingers 162A to 162D other than reflector electrode finger 162E. Reflector electrode finger 162E closest to IDT electrode 61 has a smaller width in direction 10B than reflector electrode finger 162A which is the farthest from IDT electrode 61. In this case, even if comb-shaped electrodes 61A and 61B include weighted parts 61K and 61M, the mask for forming electrodes can have a large aperture ratio at gap 14, making it less likely that short circuits occur between IDT electrode 61 and reflector electrode 62A.

Reflector electrode 63A includes reflector electrode fingers 163A, 163B, 163C, 163D, and 163E extending in direction 10B, and bus bars 163F and 163G. Bus bar 163F is connected with respective one ends of these reflector electrode fingers, and bus bar 163G is connected with respective other ends of these reflector electrode fingers.

Reflector electrode finger 163E out of reflector electrode fingers 163A to 163E which is closest to IDT electrode 61 has a smaller width in direction 10B than reflector electrode fingers 163A to 163D other than electrode finger 163E. Reflector electrode finger 163E closest to IDT electrode 61 has a smaller width in direction 10B than reflector electrode finger 163A which is the farthest from IDT electrode 61. In this case, even if comb-shaped electrodes 61A and 61B include weighted parts 61K and 61M, the mask for forming electrodes can have a large aperture ratio at gap 14, making it less likely that short circuits occur between IDT electrode 61 and reflector electrode 63A.

The widths of reflector electrode fingers 162E and 163E which is closest to IDT electrode 61 in direction 10B are preferably not less than the interdigitating width W of IDT electrode 61. With this range, it is possible to prevent short circuits between IDT electrode 61 and each of reflector electrodes 62A and 63A, without decreasing the reflection efficiency of the acoustic wave excited by IDT electrode 61.

Figure 7B:
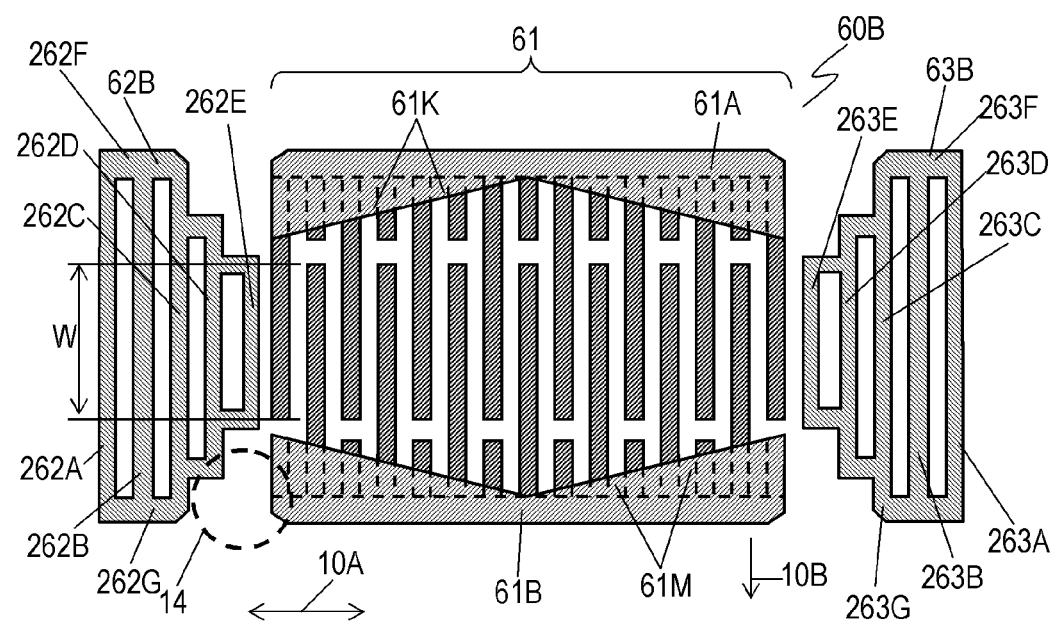
FIG. 7B is a plan view of another acoustic wave filter according to the fourth exemplary embodiment.

FIG. 7B is a plan view of further acoustic wave device 60B of the fourth exemplary embodiment. In FIG. 7B, components identical to those of acoustic wave device 60A shown in FIG. 7A are denoted by the same reference numerals. Acoustic wave device 60B includes reflector electrodes 62B and 63B instead of reflector electrodes 62A and 63A of acoustic wave device 70A shown in FIG. 7A.

Reflector electrode 62B includes reflector electrode fingers 262A, 262B, 262C, 262D, and 262E extending in direction 10B, and bus bars 262F and 262G. Bus bar 262F is connected with respective one ends of these reflector electrode fingers, and bus bar 262G is connects respective other ends of these reflector electrode fingers. Reflector electrode fingers 262E and 262D out of reflector electrode fingers 262A to 262E which are the closest and the second closest to IDT electrode 61, respectively, have smaller widths in direction 10B than reflector electrode fingers 262A, 262B, and 262C other than reflector electrode fingers 262E and 262D. That is, reflector electrode finger 262E closest to IDT electrode 61 has a smaller width in direction 10B than reflector electrode finger 262A which is the farthest from IDT electrode 61. Reflector electrode finger 262E has a smaller width in direction 10B than reflector electrode finger 262D. Even if comb-shaped electrodes 61A and 61B include weighted parts 61K and 61M, the mask for forming electrodes can have a large aperture ratio at gap 14, hence preventing short circuits occur between IDT electrode 61 and reflector electrode 62B.

Reflector electrode 63B includes reflector electrode fingers 263A, 263B, 263C, 263D, and 263E extending in direction 10B, and bus bars 263F and 263G. Bus bar 263F is connected with respective one ends of these reflector electrode fingers, and bus bar 263G is connects respective other ends of these reflector electrode fingers. Reflector electrode fingers 263E and 263D out of reflector electrode fingers 263A through 263E which are the closest and the second closest to IDT electrode 61, respectively, have smaller widths in direction 10B than reflector electrode fingers 263A, 263B, and 263C other than reflector electrode fingers 263E and 263D. That is, reflector electrode finger 263E closest to IDT electrode 61 has a smaller width in direction 10B than reflector electrode finger 263A which is the farthest from IDT electrode 61. Reflector electrode finger 263E has a smaller width in direction 10B than reflector electrode finger 263D. Even if comb-shaped electrodes 61A and 61B include weighted parts 61K and 61M, the mask for forming electrodes can have a large aperture ratio at gap 14, hence preventing short circuits occur between IDT electrode 61 and reflector electrode 63B.

The widths of reflector electrode fingers 262E and 263E closest to IDT electrode 61 in direction 10B are preferably not less than the interdigitating width W of IDT electrode 61. This range can prevent short circuits between IDT electrode 61 and each of reflector electrodes 62B and 63B, without decreasing the reflection efficiency of the acoustic wave excited by IDT electrode 61.

INDUSTRIAL APPLICABILITY

An acoustic wave device according to the present invention prevents short circuits between an IDT electrode and a separate electrode, and has excellent characteristics of suppressing unwanted waves, hence being particularly applicable to compact communication devices, such as mobile phones.

REFERENCE MARKS IN THE DRAWINGS 11 interdigital transducer (IDT) electrode
11A comb-shaped electrode (first comb-shaped electrode)
11B comb-shaped electrode (second comb-shaped electrode)
11C bus bar (first bus bar)
11D interdigitated electrode finger (first interdigitated electrode finger)
11F dummy electrode finger (first dummy electrode finger)
11G bus bar (second bus bar)
11H interdigitated electrode finger (second interdigitated electrode finger)
11J dummy electrode finger (second dummy electrode finger)
11K weighted part
11L non-weighted part
11N non-weighted part
12 separate electrode (first separate electrode), reflector electrode
13 separate electrode (second separate electrode), reflector electrode
15A interdigitated region
15B non-interdigitated region
21 piezoelectric substrate

The invention claimed is:

1. An acoustic wave device comprising:
a piezoelectric substrate having a surface;
a first interdigital transducer (IDT) electrode including
a first comb-shaped electrode formed on the surface of the piezoelectric substrate, and
a second comb-shaped electrode formed on the surface of the piezoelectric substrate, the second comb-shaped electrode facing the first comb-shaped electrode; and
a first separate electrode formed on the surface of the piezoelectric substrate, wherein
the first IDT electrode and the first separate electrode are arranged in a first direction,
the first comb-shaped electrode includes:
a first bus bar extending in the first direction;
a plurality of first interdigitated electrode fingers extending from the first bus bar toward the second comb-shaped electrode in a second direction different from the first direction; and
a plurality of first dummy electrode fingers extending from the first bus bar toward the second comb-shaped electrode in the second direction,
the second comb-shaped electrode includes:
a second bus bar extending in the first direction;
a plurality of second interdigitated electrode fingers extending from the second bus bar toward the first comb-shaped electrode in a third direction opposite to the second direction, the second interdigitated electrode fingers being interdigitated with the first interdigitated electrode fingers in an interdigitated region, the second interdigitated electrode fingers facing the first dummy electrode fingers in the third direction;
a plurality of second dummy electrode fingers extending from the second bus bar toward the first comb-shaped electrode in the third direction, the second dummy electrode fingers facing the first interdigitated electrode fingers in the third direction;
a plurality of weighted parts having electrodes at spaces between the second interdigitated electrode fingers and the second dummy electrode fingers, the weighted parts being formed in a non-interdigitated region outside the interdigitated region; and
a non-weighted part having no electrode at a space out of the spaces which is closest to the separate electrode, the non-weighted part being disposed in the non-interdigitated region,
wherein the weighted parts have widths gradually increasing from a center of the first bus bar to both ends of the first bus bar in the second direction.

2. The acoustic wave device of claim 1, wherein the first separate electrode is a reflector electrode.

3. The acoustic wave device of claim 1, further comprising a second separate electrode formed on the surface of the piezoelectric substrate, wherein
the first IDT electrode is arranged between the first separate electrode and the second separate electrode in the first direction.

4. The acoustic wave device of claim 3, wherein the first separate electrode and the second separate electrode are reflector electrodes.

5. The acoustic wave device of claim 1, wherein the first separate electrode is a second IDT electrode including third and fourth comb-shaped electrodes facing each other.

6. An acoustic wave filter comprising:
a first acoustic wave device; and
a second acoustic wave device connected to the first acoustic wave device, wherein
at least one of the first acoustic wave device and the second acoustic wave device comprises the acoustic wave device of claim 1.

7. The acoustic wave device of claim 1, wherein a distance between the first IDT electrode and the first separate electrode is not more than a distance between each of the first interdigitated electrode fingers and each of the second dummy electrode fingers facing each other in the third direction.

8. The acoustic wave device of claim 1, wherein the piezoelectric substrate is made of $LiNbO_3$.

9. The acoustic wave device of claim 1, further comprising a dielectric thin film formed on the surface of the piezoelectric substrate so as to coat the IDT electrode.

10. The acoustic wave device of claim 1, wherein an outermost dummy electrode finger out of the first dummy electrode fingers which is closest to the first separate electrode has a width in the first direction smaller than any other of the second first dummy electrode fingers.

11. An acoustic wave device comprising:
a piezoelectric substrate having a surface;
a first interdigital transducer (IDT) electrode including
a first comb-shaped electrode formed on the surface of the piezoelectric substrate, and
a second comb-shaped electrode formed on the surface of the piezoelectric substrate, the second comb-shaped electrode facing the first comb-shaped electrode; and
a first separate electrode formed on the surface of the piezoelectric substrate, wherein
the first IDT electrode and the first separate electrode are arranged in a first direction,
the first comb-shaped electrode includes:
a first bus bar extending in the first direction;
a plurality of first interdigitated electrode fingers extending from the first bus bar toward the second comb-shaped electrode in a second direction different from the first direction; and
a plurality of first dummy electrode fingers extending from the first bus bar toward the second comb-shaped electrode in the second direction,
the second comb-shaped electrode includes:
a second bus bar extending in the first direction;
a plurality of second interdigitated electrode fingers extending from the second bus bar toward the first comb-shaped electrode in a third direction opposite to the second direction, the second interdigitated electrode fingers being interdigitated with the first interdigitated electrode fingers in an interdigitated region, the second interdigitated electrode fingers facing the first dummy electrode fingers in the third direction;
a plurality of second dummy electrode fingers extending from the second bus bar toward the first comb-shaped electrode in the third direction, the second dummy electrode fingers facing the first interdigitated electrode fingers in the third direction;
a plurality of weighted parts having electrodes at spaces between the second interdigitated electrode fingers and the second dummy electrode fingers, the weighted parts being formed in a non-interdigitated region outside the interdigitated region; and
a non-weighted part having no electrode at a space out of the spaces which is closest to the separate electrode, the non-weighted part being disposed in the non-interdigitated region, and
a distance between the first IDT electrode and the first separate electrode is not more than a distance between each of the first interdigitated electrode fingers and each of the second dummy electrode fingers facing each other in the third direction.

12. The acoustic wave device of claim 11, wherein the first separate electrode is a reflector electrode.

13. The acoustic wave device of claim 11, further comprising
a second separate electrode formed on the surface of the piezoelectric substrate, wherein
the first IDT electrode is arranged between the first separate electrode and the second separate electrode in the first direction.

14. The acoustic wave device of claim 13, wherein the first separate electrode and the second separate electrode are reflector electrodes.

15. The acoustic wave device of claim 11, wherein the first separate electrode is a second IDT electrode including third and fourth comb-shaped electrodes facing each other.

16. The acoustic wave device of claim 11, wherein the piezoelectric substrate is made of $LiNbO_3$.

17. The acoustic wave device of claim 11, further comprising
a dielectric thin film formed on the surface of the piezoelectric substrate so as to coat the IDT electrode.

18. An acoustic wave device comprising:
a piezoelectric substrate having a surface;
a first interdigital transducer (IDT) electrode including
a first comb-shaped electrode formed on the surface of the piezoelectric substrate, and
a second comb-shaped electrode formed on the surface of the piezoelectric substrate, the second comb-shaped electrode facing the first comb-shaped electrode; and
a first separate electrode formed on the surface of the piezoelectric substrate, wherein
the first IDT electrode and the first separate electrode are arranged in a first direction,
the first comb-shaped electrode includes:
a first bus bar extending in the first direction;
a plurality of first interdigitated electrode fingers extending from the first bus bar toward the second comb-shaped electrode in a second direction different from the first direction; and
a plurality of first dummy electrode fingers extending from the first bus bar toward the second comb-shaped electrode in the second direction,
the second comb-shaped electrode includes:
a second bus bar extending in the first direction;
a plurality of second interdigitated electrode fingers extending from the second bus bar toward the first comb-shaped electrode in a third direction opposite to the second direction, the second interdigitated electrode fingers being interdigitated with the first interdigitated electrode fingers in an interdigitated region, the second interdigitated electrode fingers facing the first dummy electrode fingers in the third direction; and
a plurality of second dummy electrode fingers extending from the second bus bar toward the first comb-shaped electrode in the third direction, the second dummy electrode fingers facing the first interdigitated electrode fingers in the third direction,
the second bus bar includes:
a plurality of weighted parts located apart from the first bus bar in the second direction by distances decreasing as approaching the first separate electrode; and
a non-weighted part provided between a second dummy electrode out of the plurality of second dummy electrode which is the closest to the first separate electrode and a second interdigitated electrode out of the plurality of second interdigitated electrodes which is the closest to the first separate electrode, wherein a distance from the non-weighted part to the first bus bar in the second direction is larger than any of distances from the first bus bar to the plurality of weighted parts in the second direction, and the weighted parts have widths in the second direction gradually increasing from a center of the second bus bar to both ends of the second bus bar.

\* \* \* \* \*